(12) United States Patent
Urano et al.

(10) Patent No.: US 8,085,985 B2
(45) Date of Patent: Dec. 27, 2011

(54) METHOD FOR DETERMINING DISTANCE BETWEEN REFERENCE MEMBER AND MELT SURFACE, METHOD FOR CONTROLLING LOCATION OF MELT SURFACE USING THE SAME, AND APPARATUS FOR PRODUCTION SILICON SINGLE CRYSTAL

(75) Inventors: Masahiko Urano, Fukushima (JP); Izumi Fusegawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 744 days.

(21) Appl. No.: 12/225,918

(22) PCT Filed: Jan. 31, 2007

(86) PCT No.: PCT/JP2007/051548
§ 371 (c)(1),
(2), (4) Date: Oct. 2, 2008

(87) PCT Pub. No.: WO2007/122833
PCT Pub. Date: Nov. 1, 2007

(65) Prior Publication Data
US 2009/0232359 A1    Sep. 17, 2009

(30) Foreign Application Priority Data

Apr. 25, 2006    (JP) .................................. 2006-120408

(51) Int. Cl.
*G06K 9/00*    (2006.01)

(52) U.S. Cl. ........................... 382/106; 382/100; 117/15

(58) Field of Classification Search ................... 382/100, 382/106; 117/14–15
See application file for complete search history.

(56) References Cited

U.S. PATENT DOCUMENTS

| 5,437,242 A | 8/1995 | Hofstetter et al. |
| 5,487,354 A | 1/1996 | Von Ammon et al. |

(Continued)

FOREIGN PATENT DOCUMENTS

JP    A-06-056588    3/1994

(Continued)

OTHER PUBLICATIONS

Ueki et al., "Analysis of Side-Wall Structure of Growth-in Twin-Type Octahedral Defects in Czochralski Silicon," *Japanese Journal of Applied Physics*, vol. 37, No. 4A, pp. 1667-1670, Apr. 1998.

(Continued)

*Primary Examiner* — Jingge Wu
(74) *Attorney, Agent, or Firm* — Oliff & Berridge, PLC

(57) ABSTRACT

The present invention is a method for determining a relative distance between a reference member placed above a melt surface and the melt surface upon pulling a silicon single crystal out of a raw material melt in a crucible by a CZ method characterized by at least: pulling the silicon single crystal applying a magnetic field; taking a picture of a real image of the reference member and a mirror image of the reference member reflected on the melt surface with a detector; processing the picture taken of the real image and the mirror image of the reference member as different pictures by separating the picture taken; and calculating the relative distance between the real image and the mirror image of the reference member from the processed pictures to determine the relative distance between the reference member and the melt surface.

29 Claims, 6 Drawing Sheets

U.S. PATENT DOCUMENTS

| | | | |
|---|---|---|---|
| 5,726,752 A * | 3/1998 | Uno et al. | 356/246 |
| 5,746,825 A * | 5/1998 | Von Ammon et al. | 117/14 |
| 6,171,391 B1 | 1/2001 | Fuerhoff et al. | |
| 6,572,699 B1 | 6/2003 | Moriya et al. | |
| 6,592,662 B2 | 7/2003 | Fusegawa et al. | |
| 7,264,674 B2 * | 9/2007 | Takanashi et al. | 117/15 |
| 2002/0029738 A1 | 3/2002 | Takanashi et al. | |
| 2005/0022722 A1 | 2/2005 | Takanashi et al. | |
| 2010/0064964 A1 * | 3/2010 | Hoshi et al. | 117/15 |

FOREIGN PATENT DOCUMENTS

| | | |
|---|---|---|
| JP | A-06-116083 | 4/1994 |
| JP | A-07-257991 | 10/1995 |
| JP | A-07-330484 | 12/1995 |
| JP | A-2000-264779 | 9/2000 |
| JP | A-2001-342095 | 12/2001 |
| JP | A-2002-527341 | 8/2002 |
| JP | A-2003-055084 | 2/2003 |
| WO | WO 00/22200 A1 | 4/2000 |
| WO | WO 01/63027 A1 | 8/2001 |

OTHER PUBLICATIONS

Takeno et al., "Evaluation Of Microdefects In As-Grown Silicon Crystals," *Materials Research Society Symposium Proceedings*, vol. 262, pp. 51-56, 1992.

Voronkov, "The Mechanism of Swirl Defects Formation in Silicon," *Journal of Crystal Growth*, vol. 59, No. 3, pp. 625-643, 1982.

Hourai et al., "Control of Grown-in Defects in Si Crystal Growth," *Japanese Association for Growth Cooperation*, vol. 25, No. 5, pp. 207-213, 1998.

* cited by examiner (a)

(b)

(a)

(b)

METHOD FOR DETERMINING DISTANCE BETWEEN REFERENCE MEMBER AND MELT SURFACE, METHOD FOR CONTROLLING LOCATION OF MELT SURFACE USING THE SAME, AND APPARATUS FOR PRODUCTION SILICON SINGLE CRYSTAL

TECHNICAL FIELD

The present invention relates to a method for determining a distance between a reference member placed above a melt surface and the melt surface upon pulling a silicon single crystal out of a raw material melt in a crucible by a CZ (Czochralski) method.

BACKGROUND ART

As a method for producing a silicon single crystal used in producing a semiconductor device, a CZ (Czochralski) method, in which a silicon single crystal is pulled out of a raw material melt in a quartz crucible while being grown, is widely employed. In a CZ method, a seed crystal is immersed in a raw material melt (a silicon melt) in a quartz crucible under an inert gas atmosphere and a silicon single crystal having a desired diameter is grown by pulling the seed crystal while rotating the quartz crucible and the seed crystal.

With the advancement of high integration and accompanying miniaturization of semiconductor devices, growth defects in a silicon wafer (grown-in defects) have recently been a problem. Crystal defects result in degrading the characteristics of semiconductor devices and is more and more influential as the miniaturization of the device advances. As such growth defects, octahedral void-like defects as a cluster of vacancies in a silicon single crystal produced by a CZ method (Analysis of side-wall structure of grown-in twin-type octahedral defects in Czochralski silicon, Jpn. J. Appl. Phys. Vol. 37 (1998) pp. 1667-1670), a dislocation cluster formed as a cluster of interstitial silicon (Evaluation of microdefects in as-grown silicon crystals, Mat. Res. Soc. Symp. Proc. Vol. 262 (1992) pp. 51-56) and the like are known.

It is indicated that the introduced amount of these kinds of growth defects is determined by a temperature gradient of a crystal at a growth interface and a growth rate of a silicon single crystal (The mechanism of swirl defects formation in silicon, Journal of Crystal growth, 1982, pp. 625-643). Regarding a method for producing a low-defect silicon single crystal using this, Japanese Patent Application Laid-Open Publication No. H6-56588, for example, discloses reducing the growth rate of a silicon single crystal and Japanese Patent Application Laid-Open Publication No. H7-257991 discloses pulling a silicon single crystal at a rate not exceeding the maximum pulling rate approximately proportional to the temperature gradient in a solid-liquid interface area of a silicon single crystal. In addition, an improved CZ method, which focuses on a temperature gradient (G) and a growth rate (V) during the crystal growth or the like, is also reported (The Japanese Association for Crystal Growth Cooperation vol. 25 No. 5, 1998) and it is necessary to control the crystal temperature gradient with high precision.

In these methods, in order to control the crystal temperature gradient, there is provided a cylinder-shaped or inverted cone-shaped structure for insulating the radiant heat (a heat insulating member) above the melt surface around the silicon single crystal to be grown. Because this steepens the crystal temperature gradient at a high temperature of a crystal, these methods have the advantage of obtaining a defect-free crystal at high speed. However, in order to control the crystal temperature gradient accurately, it is necessary to control with very high precision the distance between the melt surface and the heat insulating member located above the melt surface in such a manner that a predetermined distance is maintained. However, it has been difficult to control with precision the distance between the melt surface and the heat insulating member in such a manner that the predetermined distance is maintained.

Furthermore, with the upsizing of a crystal diameter, the location of the melt surface is caused to change greatly by the weight of the quartz crucible (variations of wall thickness), deformation during operation, swelling and the like, thereby causing a problem that the location of the melt surface changes for every crystal growth batch. Therefore it is getting more and more difficult to control with precision the distance between the melt surface and the heat insulating member in such a manner that the predetermined distance is maintained.

For the improvement of these, for example, Japanese Patent Application Laid-Open Publication No. H6-116083 proposes placing a reference member in a CZ furnace and determining a relative distance between a real image of the reference member and a mirror image of the reference member reflected on the melt surface to determine the distance between the reference member and the melt surface. Then, based on a result of the determination, the distance between the melt surface and the heat insulating member is controlled with precision in such a manner that the predetermined distance is maintained.

Moreover, Japanese Patent Application Laid-Open Publication No. 2001-342095 discloses a method of taking into consideration the curvature of the raw material melt resulting from the rotation of the crucible in order to achieve the stability of the mirror image of the reference member.

In these methods, a picture is taken of a real image of the reference member and a mirror image of the reference member with a detector such as an optical camera and the brightness of the picture taken of the real image and the mirror image of the reference member is quantized into two output values (binarization) based on a certain predetermined threshold value (a threshold value of binarization level). In other words, a distinction is made depending on whether a spot is bright or dark compared with the threshold value of binarization level. Subsequently, measurement is made as to where the location of an edge thereof is and the values of the measurement are converted to determine the distance between the real image and the mirror image.

However, with the passage of time for a crystal growth process, the change in the brightness of the mirror image of the reference member reflected on the melt surface fluctuates a value detected with the optical camera before binarization or noise of a splash of melt resting on a structural unit in the CZ furnace and the like different from the mirror image of the reference member is detected, thereby causing a problem that the distance between the reference member and the melt surface is not determined stably or accurately.

Here, FIG. 3 are illustrations showing that it is impossible to determine a relative distance between the reference member and the melt surface accurately by a conventional method because the result of the determination changes. FIG. 3(a) shows a steady state and FIG. 3(b) shows a state where the brightness of the mirror image has fluctuated and increased. As is clear from FIG. 3, because the value detected with the optical camera before binarization fluctuates with the change in the brightness of the mirror image, accurate determination is not to be carried out by a conventional method.

On the other hand, for example, in the case of producing a silicon single crystal of 300 mm or more in diameter without applying a magnetic field from a raw material melt contained in a quartz crucible of 800 mm or more in bore diameter, there has also been a problem that, due to the vibration of the melt surface, the precise location of the melt surface is not to be detected stably. The relative distance between the reference member and the melt surface is not to be determined stably or accurately in this case, either.

When the determination result of the relative distance between the reference member and the melt surface is inaccurate, the distance between the melt surface and the heat insulating member is not to be controlled with precision in such a manner that the predetermined distance is maintained. Consequently, a silicon single crystal of desired quality is not to be efficiently produced.

DISCLOSURE OF THE INVENTION

The present invention was accomplished in view of these problems and an object of the present invention is to provide a method for determining a distance between a reference member and a melt surface that makes it possible to determine the relative distance between the reference member and the melt surface more stably and more accurately.

In order to attain the above-mentioned objective, the present invention provides a method for determining a relative distance between a reference member placed above a melt surface and the melt surface upon pulling a silicon single crystal out of a raw material melt in a crucible by a CZ (Czochralski) method characterized by at least:

pulling the silicon single crystal applying a magnetic field; taking a picture of a real image of the reference member and a mirror image of the reference member reflected on the melt surface with a detector; processing the picture of the real image and the mirror image of the reference member as different pictures by separating the picture taken; and calculating the relative distance between the real image and the mirror image of the reference member from the processed pictures to determine the relative distance between the reference member and the melt surface.

In this way, in the present invention, pulling of the silicon single crystal is performed applying a magnetic field. Thus the vibration of the melt surface can be sufficiently reduced and the location of the melt surface can be detected more stably and more accurately.

Furthermore, in the present invention, a picture of the real image of the reference member and a mirror image of the reference member reflected on the melt surface is taken with a detector and the picture taken of the real image and the mirror image of the reference member is processed as different pictures by separating the picture taken. Consequently it is possible to set a binarization level at an appropriate level for the picture of the real image and the picture of the mirror image each. Therefore even in such a case where the brightness of the mirror image changes when the silicon single crystal is pulled, the relative distance between the reference member and the melt surface is determined more accurately.

In this way, according to the present invention, it is possible to reduce the vibration of the melt surface sufficiently and set a binarization level at an appropriate level for the picture of the real image and the picture of the mirror image each, therefore the relative distance between the reference member and the melt surface is determined more stably and more accurately.

It should be noted that, here, "reference member" in the present invention is for causing the melt surface to reflect a mirror image in order to detect the location of the melt surface by determining the distance between the real image and the mirror image, which makes it possible to control the distance between the melt surface and the heat insulating member or the like by controlling the relative distance between the reference member and the melt surface. The reference member may be, for example, the heat insulating member itself or, as described later, a protruding portion placed on a lower end of the heat insulating member but is not limited to these.

In addition, in the method for determining a distance between the reference member and the melt surface of the present invention, the magnetic field to be applied is preferably a magnetic field having a central magnetic field intensity of 2000 G to 5000 G.

When the magnetic field to be applied is the magnetic field having the central magnetic field intensity of 2000 G to 5000 G, the melt surface hardly vibrates, therefore the location of the melt surface is detected more stably and more accurately.

In addition, in the method for determining a distance between the reference member and the melt surface of the present invention, the reference member may be a protruding portion placed on a lower end of a heat insulating member above the melt surface.

As described above, when the reference member is the protruding portion placed on the lower end of the heat insulating member above the melt surface, it is easier to capture a real image thereof within a determination area of the detector and to receive the reflection from the melt surface and the like also. Thus the brightness of the mirror image reflected on the melt surface is increased. Therefore the difference of the brightness between the mirror image and the background is widened to give a clearer picture and allow a stable picture processing.

Furthermore, in this case, the protruding portion placed on the lower end of the heat insulating member is preferably made of any one of a silicon crystal, a quartz material, a carbon material coated with SiC, and a carbon material coated with pyrolytic carbon.

As described above, when the protruding portion placed on the lower end of the heat insulating member is made of any one of a silicon crystal, a quartz material, a carbon material coated with SiC, and a carbon material coated with pyrolytic carbon, it is unlikely that the reference member contaminates the silicon single crystal to be grown with impurities. Therefore a silicon single crystal of higher quality can be grown.

Furthermore, a tip of the protruding portion placed on the lower end of the heat insulating member preferably has a planar shape forming an angle of 0° to 70° with the horizontal direction.

In this way, when the tip of the protruding portion placed on the lower end of the heat insulating member has a planar shape forming an angle of 0° to 70° with the horizontal direction, it is easier for the protruding portion to receive radiation from the melt surface, the quartz crucible and the like and the brightness of the mirror image reflected on the melt surface further increases. Therefore the difference of the brightness between the mirror image and the background is further widened to give a clearer picture.

In this case, the protruding portion placed on the lower end of the heat insulating member is preferably made of a silicon single crystal and treated with surface etching.

In this way, when the reference member is made of a silicon single crystal, a gloss can be added by a surface etching treatment to widen the difference of the brightness between the mirror image and the melt surface in the background.

Furthermore, in the method for determining a distance between the reference member and the melt surface, the reference member preferably has a surface gloss of 50% or more.

When the reference member has the surface gloss of 50% or more, the difference of the brightness between the mirror image and the melt surface in the background is widened more certainly, thereby making the picture clearer and allowing a stable picture processing. Therefore the distance between the reference member and the melt surface is determined more accurately.

Furthermore, in the method for determining a distance between the reference member and the melt surface of the present invention, the silicon single crystal to be pulled may have a diameter of 300 mm or more.

As described above, according to the present invention, because of the magnetic field applied, even when pulling a silicon single crystal 300 mm or more in diameter, the vibration of the melt surface is sufficiently reduced. Thus the location of the melt surface is detected more stably and more accurately. Therefore, according to the present invention, even when using a large amount of melt and pulling a silicon single crystal 300 mm or more in diameter, which makes it difficult to detect the melt surface, the relative distance between the reference member and the melt surface is determined more stably and more accurately.

Furthermore, the present invention provides a method for controlling a location of a melt surface characterized by at least determining a relative distance between a reference member and a melt surface according to the above-mentioned method and controlling the relative distance between the reference member and the melt surface based on a result of the determination.

As described above, according to the method for determining a distance between the reference member and the melt surface of the present invention, the relative distance between the reference member and the melt surface can be determined more stably and more accurately. Moreover, in the present invention, because the relative distance between the reference member and the melt surface can be controlled based on a result of the determination, the relative distance between the reference member and the melt surface can be controlled with high precision.

In addition, according to the method for controlling a location of a melt surface of the present invention, in particular, the relative distance between the reference member and the melt surface is controlled within one millimeter of a target value.

Furthermore, the present invention also provides a method for producing a silicon single crystal characterized by at least pulling a silicon single crystal by a CZ method while controlling a location of a melt surface according to the above-mentioned method.

According to a method for controlling a location of a melt surface of the present invention, by controlling the relative distance between the reference member and the melt surface with high precision, the distance between the melt surface and the heat insulating member can be precisely controlled in such a manner that the predetermined distance is maintained. Therefore the axial temperature gradient in the crystal growth direction can be controlled with very high precision and a high-quality silicon single crystal can be efficiently produced with high productivity.

The present invention also provides an apparatus for producing a silicon single crystal by a CZ method characterized by at least being equipped with a magnet for applying a magnetic field to a raw material melt upon pulling a silicon single crystal, a crucible for containing the raw material melt, a reference member placed above the melt surface for causing the melt surface to reflect a mirror image thereof, a detector for taking a picture of a real image and the mirror image of the reference member, a calculator for controlling a location of the melt surface controlling the relative distance between the reference member and the melt surface; taking a picture of the real image of the reference member and the mirror image of the reference member reflected on the melt surface with the detector; processing the picture taken of the real image and the mirror image of the reference member as different pictures; determining the relative distance between the reference member and the melt surface by calculating the relative distance between the real image and the mirror image of the reference member with the calculator for controlling the location of the melt surface; and controlling the relative distance between the reference member and the melt surface based on a result of the determination.

In this way, the apparatus for producing a silicon single crystal of the present invention is equipped with the magnet for applying a magnetic field to the raw material melt upon pulling the silicon single crystal. Thus the silicon single crystal can be pulled while a magnetic field is applied. By applying a magnetic field, the vibration of the melt surface is sufficiently reduced and the location of the melt surface is detected more stably and more accurately.

In addition, the apparatus for producing a silicon single crystal of the present invention takes a picture of the real image of the reference member and the mirror image of the reference member reflected on the melt surface with the detector and processes the picture of the real image and the mirror image of the reference member as different pictures by separating the picture taken. Therefore it is possible to set a binarization level at an appropriate level for the picture of the real image and the picture of the mirror image each.

Then, by means of calculating the relative distance between the real image and the mirror image of the reference member with the calculator for controlling the location of the melt surface, the relative distance between the reference member and the melt surface is determined. Therefore even in such a case where the brightness of the mirror image changes as the silicon single crystal is pulled, the relative distance between the reference member and the melt surface can be determined more accurately.

Furthermore, based on a result of the determination, the relative distance between the reference member and the melt surface can be controlled. Therefore the relative distance between the reference member and the melt surface is determined with high precision and controlled more stably and more accurately.

In other words, in the apparatus for producing a silicon single crystal of the present invention, based on the result of the determination, the distance between the melt surface and the heat insulating member can be controlled accurately in such a manner that the predetermined distance is maintained. Therefore the axial temperature gradient in the crystal growth direction can be controlled with very high precision and a high-quality silicon single crystal can be efficiently produced with high productivity.

Moreover, in the apparatus for producing a silicon single crystal of the present invention, the reference member may be a protruding portion placed on a lower end of a heat insulating member above the melt surface.

In this way, when the reference member is the protruding portion placed on the lower end of the heat insulating member above the melt surface, it is easier to capture the real image within the determination area of the detector and to receive the reflection from the melt surface and the like also, thereby increasing the brightness of the mirror image reflected on the melt surface. Therefore the difference of the brightness between the mirror image and the background is widened to give a clearer picture and allow a stable picture processing.

Furthermore, in the apparatus for producing a silicon single crystal of the present invention, the protruding portion placed on the lower end of the heat insulating member is preferably made of any one of a silicon crystal, a quartz material, a carbon material coated with SiC, and a carbon material coated with pyrolytic carbon.

In this way, when the protruding portion placed on the lower end of the heat insulating member is made of any one of a silicon crystal, a quartz material, a carbon material coated with SiC, and a carbon material coated with pyrolytic carbon, it is unlikely that the reference member contaminates the silicon single crystal to be grown with impurities. Therefore by using the apparatus for producing a silicon single crystal of the present invention, a silicon single crystal of higher quality can be grown.

Furthermore, on this occasion, a tip of the protruding portion placed on the lower end of the heat insulating member preferably has a planar shape forming an angle of 0° to 70° with the horizontal direction.

In this way, when the tip of the protruding portion placed on the lower end of the heat insulating member has a planar shape forming an angle of 0° to 70° with the horizontal direction, it is easier to receive radiation from the melt surface, the quartz crucible and the like, thereby increasing the brightness of the mirror image of the reference member reflected on the melt surface. Therefore the difference of the brightness between the mirror image and the background is widened to give a clearer picture.

Furthermore, the protruding portion placed on the lower end of the heat insulating member is preferably made of a silicon single crystal and treated with surface etching.

In this way, when the protruding portion placed on the lower end of the heat insulating member is a silicon single crystal, a gloss can be added by a surface etching treatment to widen the difference of the brightness between the mirror image and the melt surface in the background.

Furthermore, in the apparatus for producing a silicon single crystal of the present invention, the reference member preferably has a surface gloss of 50% or more.

In this way, when the reference member has a surface gloss of 50% or more, the difference of the brightness between the mirror image and the melt surface in the background is widened more certainly, thereby making the picture clearer and allowing a stable picture processing. Therefore the distance between the reference member and the melt surface can be determined more accurately.

As described above, according to the method for determining a distance between the reference member and the melt surface of the present invention, the relative distance between the reference member and the melt surface can be determined more stably and more accurately. In addition, by means of controlling the relative distance between the reference member and the melt surface based on a result of the determination, the relative distance between the reference member and the melt surface can be controlled with high precision. Thus the distance between the melt surface and the heat insulating member can be precisely controlled in such a manner that the predetermined distance is maintained. Therefore the axial temperature gradient in the crystal growth direction can be controlled with very high precision and a high-quality silicon single crystal can be efficiently produced with high productivity.

BEST MODES FOR CARRYING OUT THE INVENTION

Hereinafter, the present invention is described more specifically.

As mentioned above, determination of a distance between a reference member and a melt surface has conventionally been carried out by placing a reference member in a CZ furnace and determining a relative distance between a real image of the reference member and a mirror image of the reference member reflected on the melt surface. The determination is accomplished by taking a picture of a real image of the reference member and a mirror image of the reference member with a detector such as an optical camera and quantizing the brightness of the picture taken of the real image and the mirror image of the reference member into two output values (binarization) based on a certain predetermined threshold value (a threshold value of binarization level).

However, with the passage of time for a crystal growth process, the brightness of the mirror image of the reference member reflected on the melt surface is changed, thereby a value detected with the optical camera before binarization is fluctuated, or noise of a splash of melt resting on a structural unit in the CZ furnace and the like different from the mirror image of the reference member is detected, thereby causing a problem that the distance of the reference member and the melt surface is not determined stably or accurately.

Furthermore, in the case of producing a silicon single crystal of 300 mm or more in diameter, there was also a problem that, due to the vibration of the melt surface, the precise location of the melt surface is not to be detected stably.

In this way, when a result of the determination of the relative distance between the reference member and the melt surface is inaccurate, the distance between the melt surface and the heat insulating member is not to be precisely controlled in such a manner that the predetermined distance is maintained. Consequently, a silicon single crystal of desired quality is not to be efficiently produced.

Such being the case, the present inventors continued intensive research and investigation to address these problems. Finally, the present inventors hit upon an idea that, a more stable and more accurate determination of the relative distance between the reference member and the melt surface is achievable by: pulling a silicon single crystal applying a magnetic field; taking a picture of a real image and a mirror image of the reference member reflected on the melt surface with a detector; processing the picture taken of the real image and the mirror image of the reference member as different pictures; and calculating the relative distance between the real image and the mirror image of the reference member from the processed pictures, and completed the present invention.

Hereinafter, embodiments of the present invention will be described referring to figures, but the present invention is by no means limited to these embodiments.

Figure 1:
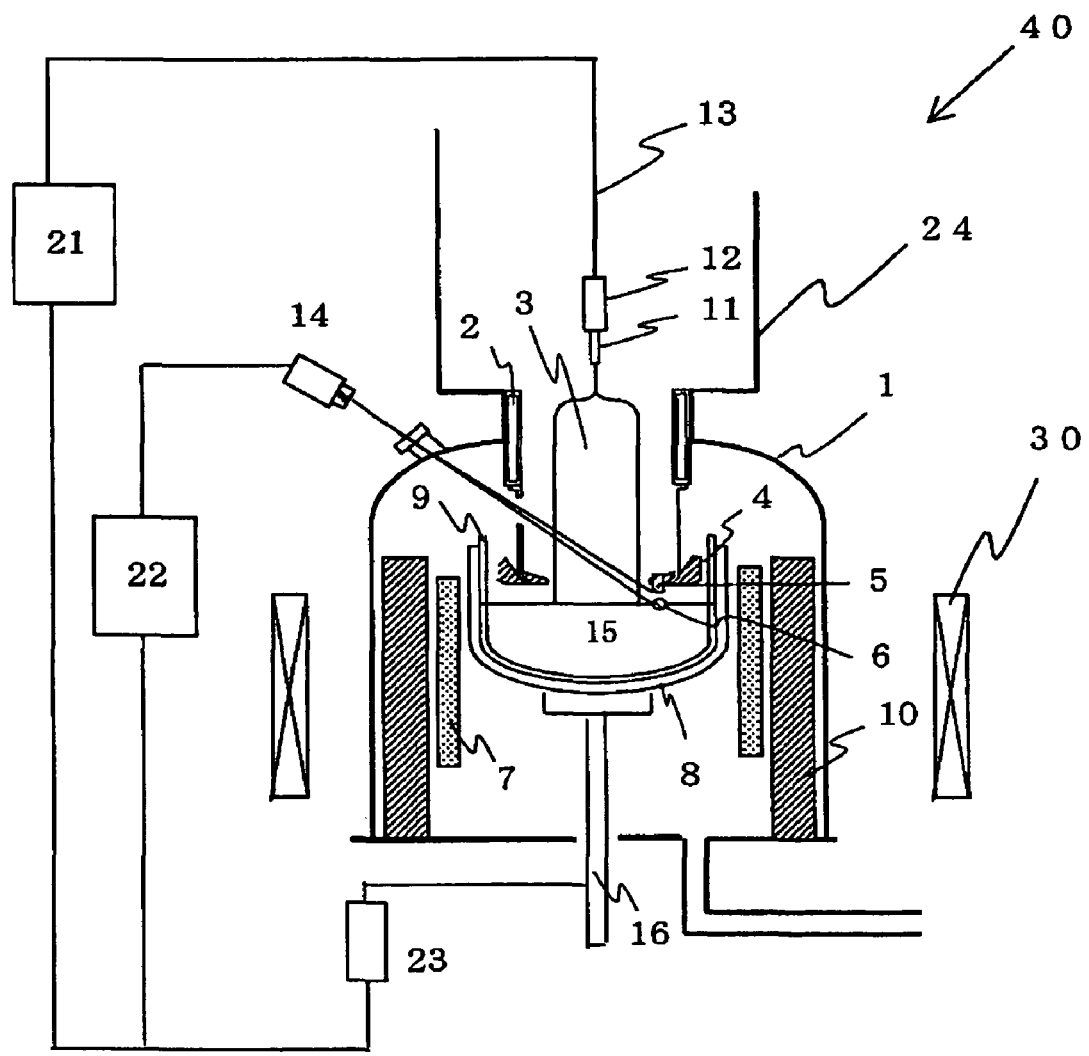
FIG. 1 is a schematic view showing an example of an apparatus for producing a silicon single crystal of the present invention.

FIG. 1 is a schematic view showing an example of an apparatus for producing a silicon single crystal of the present invention.

An apparatus 40 for producing a silicon single crystal is equipped with a magnet 30 for applying a magnetic field to a raw material melt 15 while a silicon single crystal 3 is pulled, a quartz crucible 9 containing the raw material melt 15, a reference member 5 placed above the melt surface for causing the melt surface to reflect a mirror image 6, a detector 14 for taking a picture of a real image and the mirror image of the reference member 5, a calculator 21 for controlling a location of the melt surface controlling the relative distance between the reference member 5 and the melt surface.

The apparatus 40 for producing a silicon single crystal is further equipped with a main chamber 1 for containing members such as the quartz crucible 9, a pulling chamber 24 connected above the main chamber 1, a water cooling tube 2 for cooling the silicon single crystal 3 during pulling, a heat insulating member 4 for controlling crystal temperature gradient, a heater 7 for heating and melting a polycrystalline silicon material, a graphite crucible 8 for supporting the quartz crucible 9, a heat shielding member 10 for preventing the heat from the heater 7 from directly radiating to the main chamber 1, a seed holder 12 for holding a seed crystal 11, a pulling wire 13 for pulling a silicon single crystal, a crucible shaft 16 for supporting the crucibles 8 and 9, a calculator 22 for controlling a diameter, a crucible-moving means 23 for moving, via the crucible shaft 16, the quartz crucible 9 containing the raw material melt 15 up and down.

Here, the silicon single crystal 3 is produced in the following way.

First, a polycrystalline silicon material of high purity is contained in the quartz crucible 9 and is heated to the melting point of silicon (approximately 1420° C.) or above with the heater 7 arranged around the graphite crucible 8 to be melted into the raw material melt 15. Next, after the seed crystal 11 is brought into contact with the raw material melt 15 to be melted, the pulling wire 13 is softly wound by a wire-winding mechanism (not shown) to form a necking portion and subsequently growing a constant diameter part having a constant diameter by increasing the crystal diameter. On this occasion, diameter regulation of the silicon single crystal 3 being pulled is performed with the calculator 22 for regulating a diameter based on the picture taken with a detector.

In the present invention, for example, as a silicon single crystal is pulled from the raw material melt in the crucible using such an apparatus for producing a silicon single crystal by a CZ (Czochralski) method, the distance between the reference member and the melt surface is determined in the following way.

First, the silicon single crystal is pulled applying a magnetic field with the magnet 30. This is what is called an "MCZ method." Thus the vibration of the melt surface is sufficiently reduced to give a clear picture of the mirror image reflected on the melt surface. Therefore the location of the melt surface is detected more stably and more accurately. In particular, when the applied magnetic field is a magnetic field having a central magnetic field intensity of 2000 G to 5000 G, the melt surface hardly vibrates, therefore the location of the melt surface is detected more stably and more accurately.

Furthermore, with the detector 14, a picture of a real image of the reference member 5 and a mirror image of the reference member 5 reflected on the melt surface near the silicon single crystal being pulled is taken and the picture taken of the real image and the mirror image of the reference member 5 is processed as different pictures. Consequently it is possible to set a binarization level at an appropriate level for the picture of the real image and the picture of the mirror image each. Then the real image of the reference member and the mirror image of the reference member reflected on the melt surface are captured within the determination area of the detector more certainly.

It should be noted that the detector 14 is not particularly limited but is exemplified by an optical camera (a CCD camera and the like) generally used.

Then, by calculating the relative distance between the real image and the mirror image of the reference member with the calculator 21 for controlling a location of the melt surface, the relative distance between the reference member and the melt surface is determined. Therefore even in such a case where the brightness of the mirror image changes as a silicon single crystal is pulled, the relative distance between the reference member and the melt surface is determined more accurately.

A specific description is given below of a method for determining the distance between the reference member and the melt surface.

First, an installation angle of the optical camera 14 is determined in such a manner that the real image of the reference member 5 and the mirror image of the reference member 5 reflected on the melt surface are captured. Then, when necking is started, threshold values of binarization level for the real image of the reference member 5 and the mirror image of the reference member 5 reflected on the melt surface are separately adjusted. In other words, to the picture taken with an optical camera, a separate area is allocated for each of the real image and the mirror image of the reference member 5. Next, after a determined value (a voltage value) between the real image of the reference member 5 and the mirror image of the reference member 5 reflected on the melt surface is obtained in advance, the location of the melt surface is moved; based on the amount of displacement of the determined value (a voltage value) between the real image of the reference member 5 and the mirror image of the reference member 5 reflected on the melt surface, a determined value (a voltage value) of 1 mm, for example, is obtained; based on the determined value (a voltage value) between the real image of the reference member 5 and the mirror image of the reference member 5 reflected on the melt surface, the distance between the reference member 5 and the melt surface is determined. In this way, the distance between the reference member and the melt surface is determined.

Incidentally, a threshold value of binarization level is determined, for example, in the following way. First, threshold values are varied at the time of necking when a crystal starts to be pulled to determine the minimum threshold value and the maximum threshold value between which normal determination is carried out. Next, the threshold value is set at a value smaller than the middle, a value increased by approximately 25% from the minimum, for example. The threshold value is set in consideration of the fact that the optimum threshold value is a little lower at the beginning of a crystal growth and is increased little by little later towards the latter half of a straight body.

Figure 2:
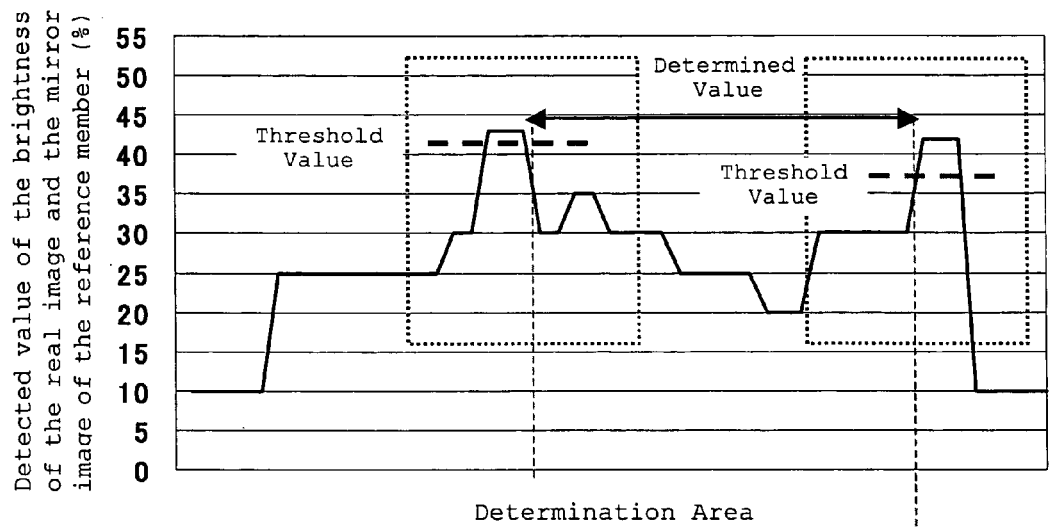
FIG. 2 are illustrations showing that a method of the present invention accurately determines a relative distance between a reference member and a melt surface.
Figure 2:
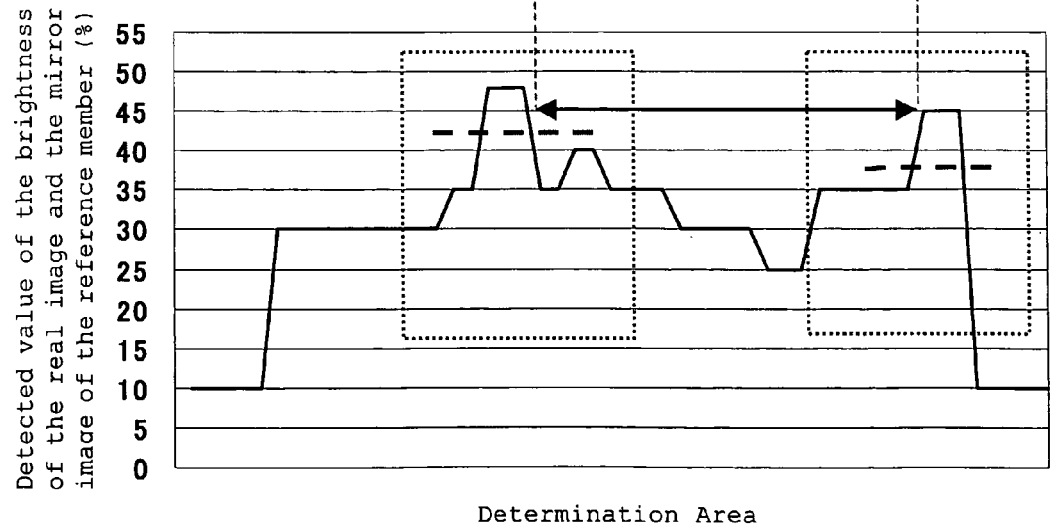

Here, FIG. 2 are illustrations showing that a method of the present invention accurately determines the relative distance between the reference member and the melt surface. FIG. 2(a) shows a steady state and FIG. 2(b) shows a state where the brightness of the mirror image is fluctuated to be brightened. The values on the vertical axis in FIG. 2 indicate detected values of the brightness of the real image and the mirror image of the reference member when the maximum value of brightness detectable with an optical camera is defined as 100%. As is clear from FIG. 2, according to a method of the present invention, because a separate area is allocated for the picture of the real image and the mirror image of the reference member each to process as different pictures, different threshold values can be determined separately for each, thus, even if the brightness of the mirror image in FIG. 2(a) is changed to that in FIG. 2(b), a result of the determination by binarization is not changed, thereby allowing accurate determination.

Figure 3:
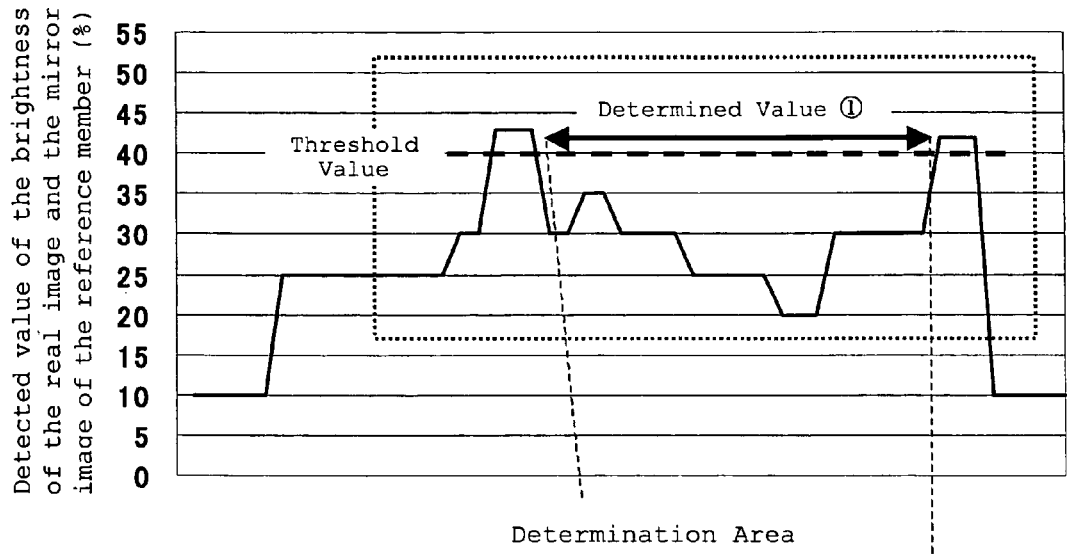
FIG. 3 are illustrations showing that it is impossible to determine a relative distance between a reference member and a melt surface accurately by a conventional method because a result of determination changes.
Figure 3:
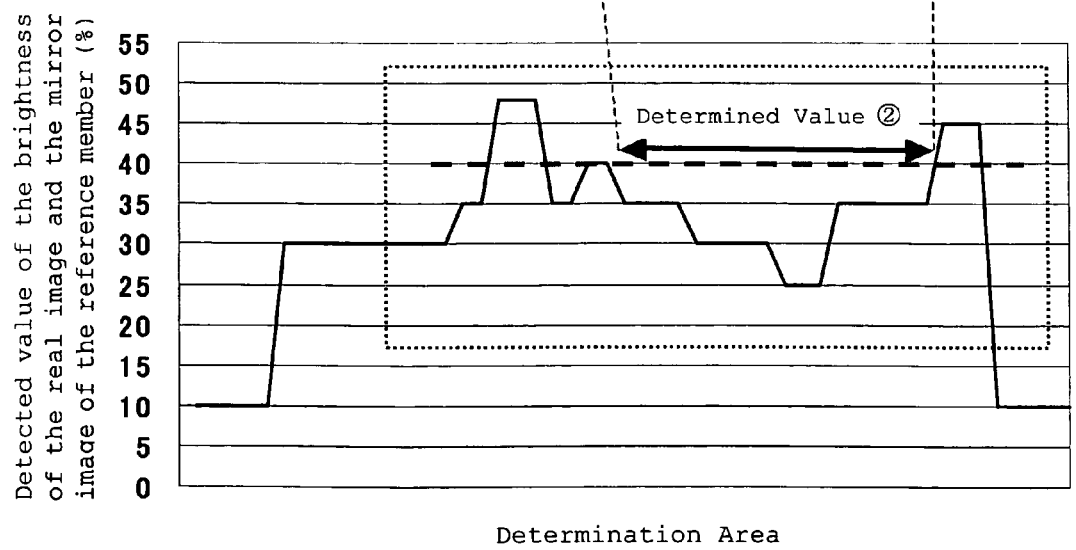

On the other hand, as shown in FIG. 3 described above, conventionally a picture taken with a detector has been treated as a single picture including the real image and the mirror image, and only one threshold value has been able to be set. Therefore when the brightness of the mirror image in FIG. 3(a) is changed to that in FIG. 3(b), the noise level reaches the threshold value and makes it impossible to determine the relative distance accurately.

Incidentally, in the apparatus for producing a silicon single crystal in FIG. 1, the reference member and the mirror image thereof are captured with an optical camera simultaneously and then areas are allocated for the picture obtained to process each area as a different picture. But the present invention is not limited to this instance and different pictures may be taken separately, for example, with an optical camera or with two cameras.

Furthermore, as in the apparatus for producing a silicon single crystal in FIG. 1, when the reference member 5 is a protruding portion placed on the lower end of the heat insulating member 4 above the melt surface, it is easier to capture the real image within the determination area of the detector and to receive the reflection from the melt surface and the like also, thereby increasing the brightness of the mirror image reflected on the melt surface. Therefore the difference of the brightness between the mirror image and the background is widened to give a clearer picture and allow a stable picture processing.

When the protruding portion 5 placed on the lower end of the heat insulating member 4 is made of any one of a silicon crystal, a quartz material, a carbon material coated with SiC (SiC-coated graphite), and a carbon material coated with pyrolytic carbon (PG-coated graphite), it is unlikely that the reference member contaminates the silicon single crystal to be grown with impurities.

Furthermore, by causing a tip of the protruding portion 5 placed on the lower end of the heat insulating member 4 to have a planar shape forming an angle of 0° to 70° with the horizontal direction (namely the melt surface), it is easier for the protruding portion 5 to receive radiation from the melt surface, the quartz crucible and the like, thereby increasing the brightness of the mirror image reflected on the melt surface. Therefore a picture is made clearer.

Figure 4:
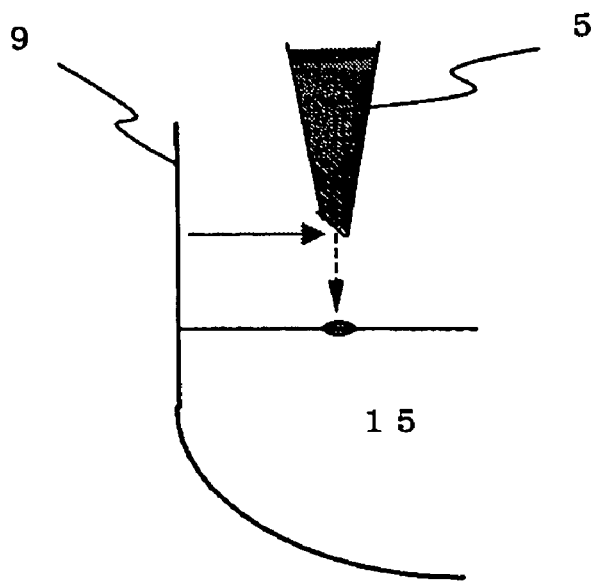
FIG. 4 is a pattern diagram showing an example of a shape of a tip of a protrusion-like reference member.

Here, as shown in FIG. 4, the tip of the protruding portion 5 preferably has a tapered shape facing the side of the crucible. While the emissivity from the raw material melt 15 is 0.318, the emissivity from the wall of the quartz crucible 9 is as high as 0.855. Consequently the protruding portion 5, caused to have a tapered shape facing the side of the crucible can receive the radiation from the wall of the quartz crucible 9 and the brightness of the mirror image reflected on the melt surface is increased.

Furthermore, when the reference member is made of a silicon single crystal, a gloss can be added by surface etching thereby widening the difference of the brightness between the mirror image and the melt surface in the background. Etching is also favorable for the removal of impurities.

In particular, when the reference member has a surface gloss of 50% or more, the difference of the brightness between the mirror image and the melt surface in the background is widened more certainly, thereby making the picture clearer and allowing a stable picture processing. Therefore the distance between the reference member and the melt surface is determined more accurately.

Furthermore, in the present invention, with the effect of the applied magnetic field, even when a silicon single crystal of 300 mm or more in diameter that necessitates a large-bore diameter crucible is pulled, the vibration of the melt surface is sufficiently reduced. Thus the location of the melt surface is detected more stably and more accurately. Therefore, according to the present invention, even when a silicon single crystal of 300 mm or more in diameter is pulled, the relative distance between the reference member and the melt surface is determined more stably and more accurately.

Next, the relative distance between the reference member and the melt surface is determined in this way and, based on a result of the determination, the relative distance between the reference member and the melt surface is controlled. In other words, after the relative distance between the reference member and the melt surface is determined by calculating the relative distance between the real image and the mirror image of the reference member with the calculator 21 for controlling a location of the melt surface, in order for the relative distance to be a target relative distance (a predetermined value), the crucible-moving means 23 is controlled to adjust the location of the quartz crucible 9 via the crucible shaft 16. Therefore the relative distance between the reference member and the melt surface is controlled with high precision. What is more, the relative distance between the reference member and the melt surface can be controlled within one millimeter of a target value.

Therefore the relative distance between the melt surface and the heat insulating member can be precisely controlled in such a manner that the predetermined distance is maintained.

Furthermore, by pulling a silicon single crystal by a CZ method while, as described above, the distance between the melt surface and the heat insulating member is precisely controlled in such a manner that the predetermined distance is maintained, it is made possible to control the axial temperature gradient in the crystal growth direction with very high precision and, for example, a defect-free silicon single crystal of 300 mm or more in diameter can be produced quite efficiently.

Hereinafter, the present invention is described more specifically showing the examples of the present invention, but these examples should by no means be construed as limiting the present invention.

EXAMPLE 1

As an apparatus for producing a silicon single crystal is the apparatus 40 for producing a silicon single crystal in FIG. 1 was used. The reference member 5, made of a silicon single crystal, is a protrusion-like object treated with surface etching and a tip of the object has a planar shape forming an angle of 40° with the horizontal direction. The surface gloss of the reference member 5 was 60%. Then the protrusion-like reference member 5 was connected on a lower end (melt surface side) of the heat insulating member 4 so as to receive radiation from the quartz crucible 9 as having a tapered shape facing the side of the crucible.

Subsequently, first, a polycrystalline silicon material was fed into the quartz crucible 9 having a bore diameter of 800 mm (for pulling a silicon single crystal of 300 mm in diameter). Then after the polycrystalline silicon material was melted with the heater 7, while applying a magnetic field having a central magnetic field intensity of 4000 G with the magnet 30, the crucible shaft 16 was moved downward by 18 mm.

After that, the determination of the distance between the reference member and the melt surface was initiated.

The determination was carried out, with a magnetic field applied, while the melt surface is moved downward by 9 mm then upward by 9 mm.

Specifically, the determination was performed by taking a picture of the real image of the reference member 5 and the mirror image of the reference member 5 reflected on the melt surface with the optical camera 14, processing the picture taken of the real image and the mirror image of the reference member 5 as different pictures by separating the picture taken (what is called processing by a two-area separation method), calculating the distance between the real image and the mirror image of the reference member 5 from the processed pictures.

Figure 5:
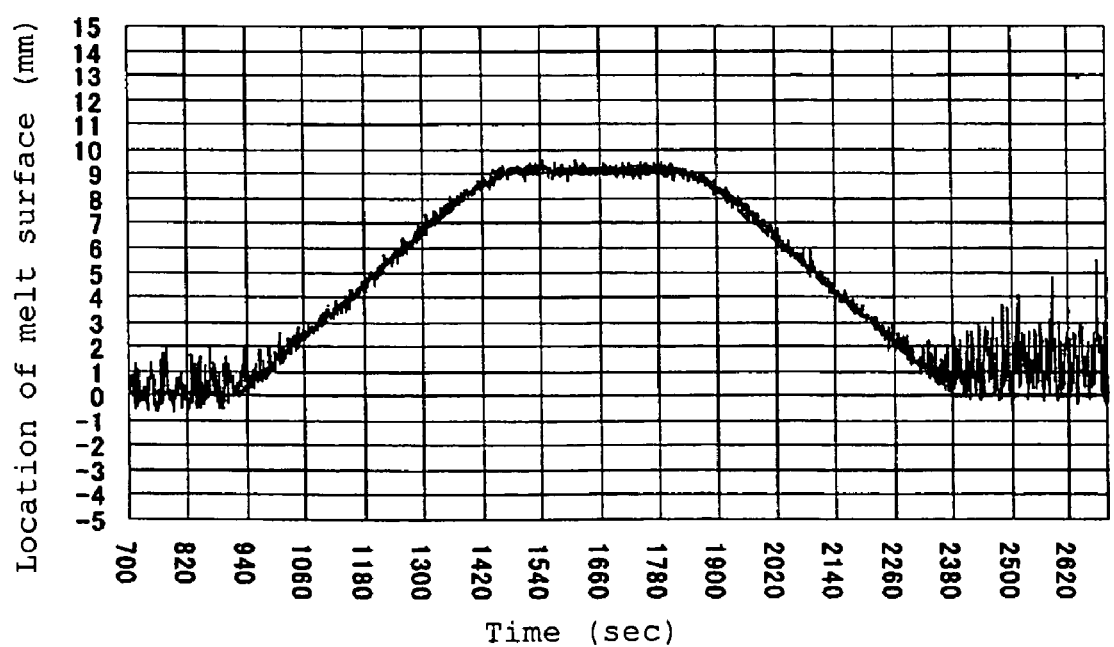
FIG. 5 is a graph showing a result of determining a relative distance between a reference member and a melt surface (Example 1).

The result of the determination is shown in FIG. 5. FIG. 5 indicates that the relative distance between the reference member and the melt surface (9 mm down, held at the point, 9 mm up) was precisely controlled within one millimeter of a target value.

EXAMPLE 2

The determination of the distance between the reference member and the melt surface was performed under the same conditions of Example 1 except that the protrusion-like reference member 5 having a surface gloss of 40% was connected on the melt surface side of the heat insulating member 4 and that the determination was carried out, with a magnetic field applied, while the melt surface is moved downward by 10 mm then upward by 10 mm.

Figure 6:
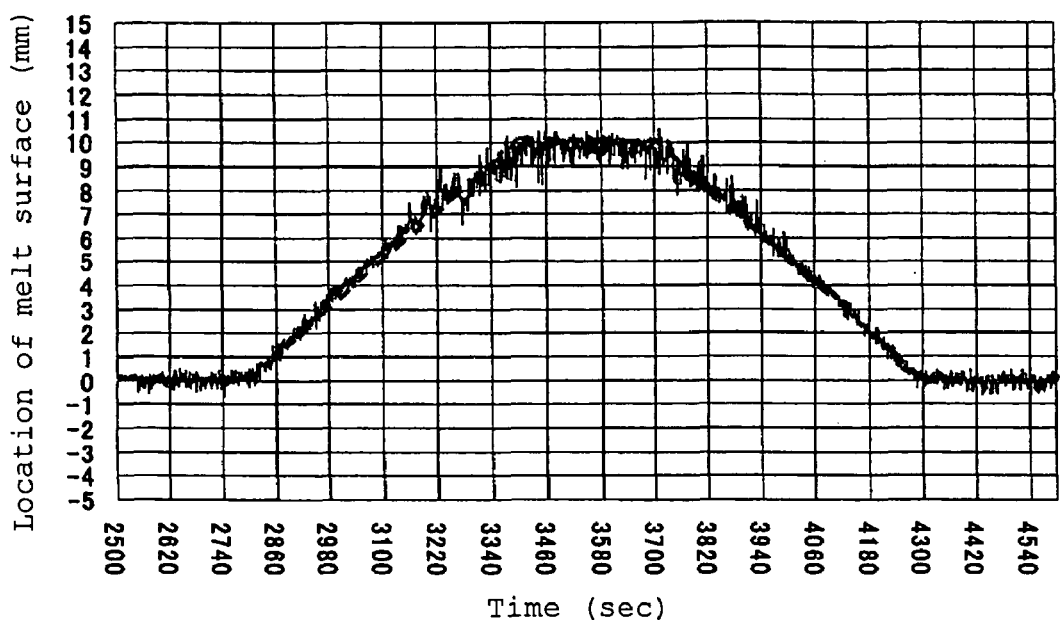
FIG. 6 is a graph showing a result of determining a relative distance between a reference member and a melt surface (Example 2).

The result of the determination is shown in FIG. 6. FIG. 6 indicates that, although somewhat inferior to that of example 1, the result of the determination of the relative distance between the reference member and the melt surface was highly precise and close to the target value.

EXAMPLE 3

The determination of the distance between the reference member and the melt surface was performed under the same conditions of Example 1 except that the protrusion-like reference member 5 having a surface gloss of 90% was connected on the melt surface side of the heat insulating member 4 and that the determination was carried out, with a magnetic field applied, while the melt surface is moved downward by 10 mm then upward by 10 mm.

Figure 7:
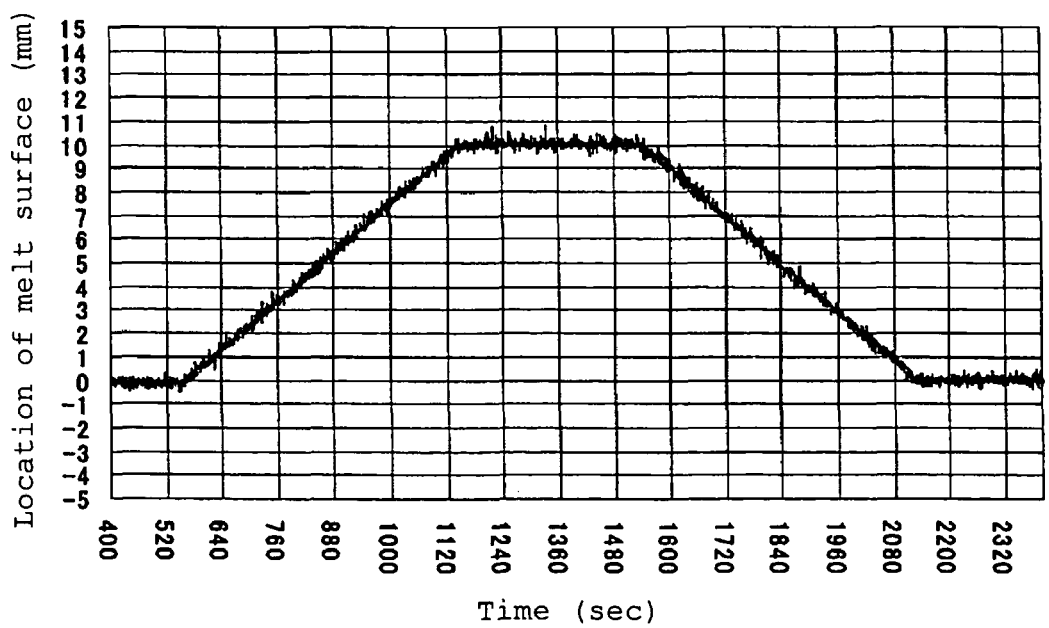
FIG. 7 is a graph showing a result of determining a relative distance between a reference member and a melt surface (Example 3).

The result of the determination is shown in FIG. 7. FIG. 7 indicates that the relative distance between the reference member and the melt surface was precisely controlled within 0.5 millimeter of a target value.

COMPARATIVE EXAMPLE 1

The determination of the distance between the reference member and the melt surface was performed under the same conditions of Example 1 except that the determination was carried out, with a magnetic field applied, while the melt surface is moved downward by 16 mm then upward by 16 mm and that a picture taken with the optical camera 14 of the real image and the mirror image of the reference member 5 is treated as a single picture (what is called a conventional one-area method treatment).

Figure 8:
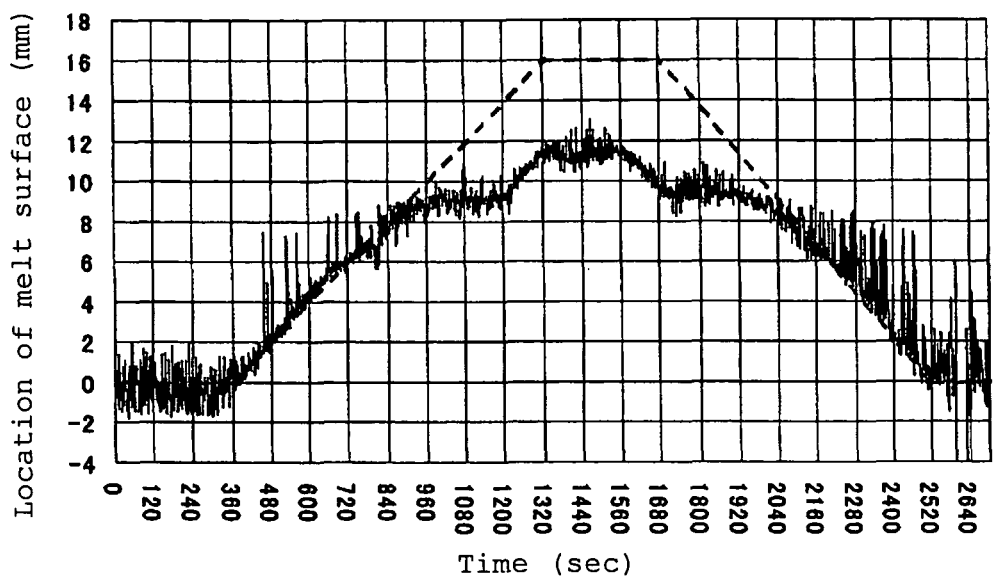
FIG. 8 is a graph showing a result of determining a relative distance between a reference member and a melt surface (Comparative Example 1).

The result of the determination is shown in FIG. 8. FIG. 8 indicates that the result of the determination of the relative distance between the reference member and the melt surface was neither highly precise nor close to the target value. Note that a dashed line in FIG. 8 is a value calculated of the ideal state.

COMPARATIVE EXAMPLE 2

The determination of the distance between the reference member and the melt surface was performed under the same conditions of Example 1 except that the determination was carried out, with no magnetic field applied, while the melt surface is moved downward by 16 mm then upward by 16 mm.

Figure 9:
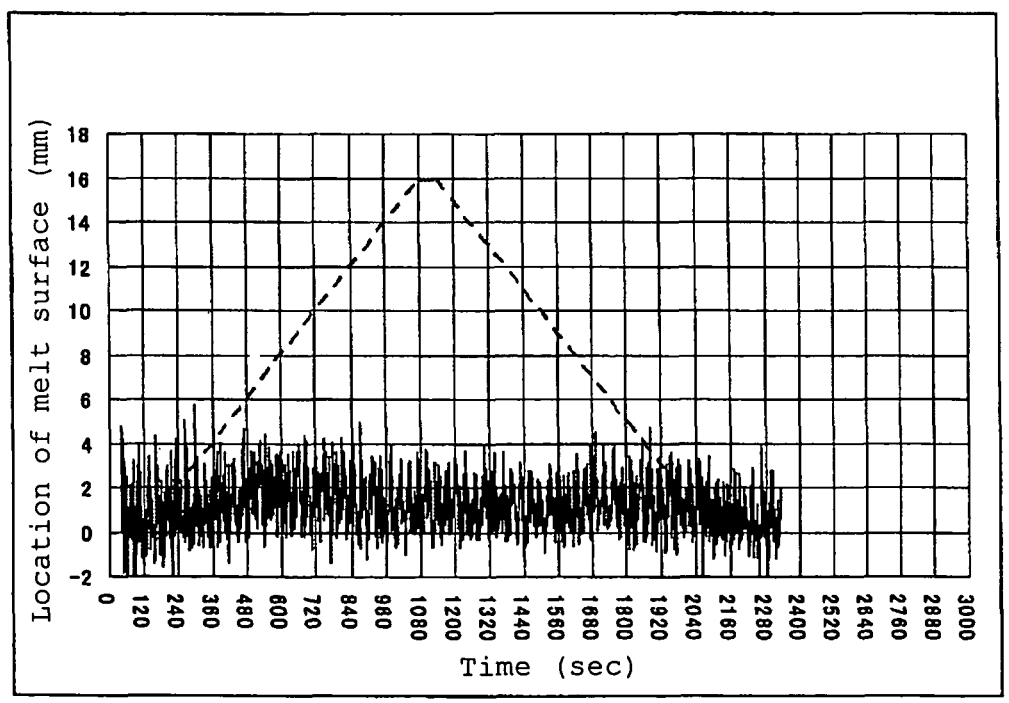
FIG. 9 is a graph showing a result of determining a relative distance between a reference member and a melt surface (Comparative Example 2).

The result of the determination is shown in FIG. 9. As shown in FIG. 9, the mirror image reflected on the surface of the raw material melt was not detected due to the vibration of the melt surface and the distance between the lower end of the heat insulating member and the mirror image reflected on the melt surface was not to be determined. Note that a dashed line in FIG. 9 is a value calculated of the ideal state.

EXAMPLE 4

Furthermore, the apparatus 40 for producing a silicon single crystal in FIG. 1 was used to pull a defect-free silicon single crystal of 300 mm in diameter. During which, a magnetic field having a central magnetic field intensity of 4000 G was applied.

The reference member 5, made of a silicon single crystal, is a protrusion-like object treated with surface etching and a tip of the object has a planar shape forming an angle of 40° with the horizontal direction. The surface gloss of the reference member 5 was 60%. Then the protrusion-like reference member 5 was connected on the lower end (melt surface side) of the heat insulating member 4 so as to receive radiation from the quartz crucible 9 as having a tapered shape facing the side of the crucible.

Furthermore, as the silicon single crystal was pulled, the relative distance between the reference member placed above the melt surface and the melt surface was determined.

The determination was performed by taking a picture of the real image of the reference member 5 and the mirror image of the reference member 5 reflected on the melt surface with the optical camera 14, processing the picture taken of the real image and the mirror image of the reference member 5 as different pictures by separating the picture taken (what is called processing by a two-area separation method), calculating the distance between the real image and the mirror image of the reference member 5 from the processed pictures.

Then, based on the result of the determination, while the relative distance between the reference member and the melt surface was controlled (the distance between the heat insulating member and the melt surface, is maintained by 25 mm), a silicon single crystal free of grown-in defect on the whole plane was pulled.

Consequently, the relative distance between the reference member and the melt surface was to be controlled within one millimeter and the distance between the melt surface and the heat insulating member was controlled precisely in such a manner that a predetermined distance (25 mm) is maintained. When defects were measured of the obtained silicon single crystal by splitting lengthwise, it was revealed that a defect-free crystal as desired in every area was obtained and that a high-quality defect-free silicon single crystal was efficiently produced with high productivity.

It is to be noted that the present invention is not limited to the above-described embodiments. The above-described embodiments are mere examples and those having the substantially same constitution as that described in the appended claims and providing the similar functions and advantages are included in the scope of the present invention.

The invention claimed is:

1. A method for determining a relative distance between a reference member placed above a melt surface and the melt surface upon pulling a silicon single crystal out of a raw material melt in a crucible by a CZ (Czochralski) method comprising at least:
    pulling the silicon single crystal applying a magnetic field;
    taking a picture of a real image of the reference member and a mirror image of the reference member reflected on the melt surface with a detector;
    processing the picture taken of the real image and the mirror image of the reference member as different pictures by separating the picture taken; and
    calculating the relative distance between the real image and the mirror image of the reference member from the processed pictures to determine the relative distance between the reference member and the melt surface.

2. The method for determining a relative distance between the reference member and the melt surface according to claim 1, wherein
    the magnetic field applied is a magnetic field having a central magnetic field intensity of 2000 G to 5000 G.

3. The method for determining a relative distance between the reference member and the melt surface according to claim 1, wherein
    the reference member is a protruding portion placed on a lower end of a heat insulating member above the melt surface.

4. The method for determining a relative distance between the reference member and the melt surface according to claim 2, wherein
    the reference member is a protruding portion placed on a lower end of a heat insulating member above the melt surface.

5. The method for determining a relative distance between the reference member and the melt surface according to claim 3, wherein
    the protruding portion placed on the lower end of the heat insulating member is made of any one of a silicon crystal, a quartz material, a carbon material coated with SiC, and a carbon material coated with pyrolytic carbon.

6. The method for determining a relative distance between the reference member and the melt surface according to claim 4, wherein
    the protruding portion placed on the lower end of the heat insulating member is made of any one of a silicon crystal, a quartz material, a carbon material coated with SiC, and a carbon material coated with pyrolytic carbon.

7. The method for determining a relative distance between the reference member and the melt surface according to claim 3, wherein
    a tip of the protruding portion placed on the lower end of the heat insulating member has a planar shape forming an angle of 0° to 70° with the horizontal direction.

8. The method for determining a relative distance between the reference member and the melt surface according to claim 4, wherein
    a tip of the protruding portion placed on the lower end of the heat insulating member has a planar shape forming an angle of 0° to 70° with the horizontal direction.

9. The method for determining a relative distance between the reference member and the melt surface according to claim 3, wherein
    the protruding portion placed on the lower end of the heat insulating member is made of a silicon single crystal and treated with surface etching.

10. The method for determining a relative distance between the reference member and the melt surface according to claim 4, wherein
    the protruding portion placed on the lower end of the heat insulating member is made of a silicon single crystal and treated with surface etching.

11. The method for determining a relative distance between the reference member and the melt surface according to claim 1, wherein
    the reference member has a surface gloss of 50% or more.

12. The method for determining a relative distance between the reference member and the melt surface according to claim 2, wherein
    the reference member has a surface gloss of 50% or more.

13. The method for determining a relative distance between the reference member and the melt surface according to claim 1, wherein
    the silicon single crystal to be pulled has a diameter of 300 mm or more.

14. The method for determining a relative distance between the reference member and the melt surface according to claim 2, wherein
    the silicon single crystal to be pulled has a diameter of 300 mm or more.

15. A method for controlling a location of a melt surface comprising at least:
    determining a relative distance between a reference member and a melt surface according to claim 1; and
    controlling the relative distance between the reference member and the melt surface based on a result of the determination.

16. A method for controlling a location of a melt surface comprising at least:
    determining a relative distance between a reference member and a melt surface according to claim 2; and
    controlling the relative distance between the reference member and the melt surface based on a result of the determination.

17. The method for controlling a location of a melt surface according to claim 15, wherein
    the relative distance between the reference member and the melt surface is controlled within one millimeter of a target value.

18. The method for controlling a location of a melt surface according to claim 16, wherein the relative distance between the reference member and the melt surface is controlled within one millimeter of a target value.

19. A method for producing a silicon single crystal comprising at least:
pulling a silicon single crystal by a CZ method while controlling the location of a melt surface according to claim 15.

20. A method for producing a silicon single crystal comprising at least:
pulling a silicon single crystal by a CZ method while controlling the location of a melt surface according to claim 18.

21. An apparatus for producing a silicon single crystal by a CZ method comprising at least:
being equipped with a magnet for applying a magnetic field to a raw material melt upon pulling a silicon single crystal, a crucible for containing the raw material melt, a reference member placed above the melt surface for causing the melt surface to reflect a mirror image thereof, a detector for taking a picture of a real image and the mirror image of the reference member, a calculator for controlling a location of the melt surface controlling the relative distance between the reference member and the melt surface;
taking a picture of the real image of the reference member and the mirror image of the reference member reflected on the melt surface with the detector;
processing the picture taken of the real image and the mirror image of the reference member as different pictures;
determining the relative distance between the reference member and the melt surface by calculating the relative distance between the real image and the mirror image of the reference member with the calculator for controlling the location of the melt surface; and
controlling the relative distance between the reference member and the melt surface based on a result of the determination.

22. The apparatus for producing a silicon single crystal according to claim 21, wherein
the reference member is a protruding portion placed on a lower end of a heat insulating member above the melt surface.

23. The apparatus for producing a silicon single crystal according to claim 22, wherein
the protruding portion placed on the lower end of the heat insulating member is made of any one of a silicon crystal, a quartz material, a carbon material coated with SiC, and a carbon material coated with pyrolytic carbon.

24. The apparatus for producing a silicon single crystal according to claim 22, wherein
a tip of the protruding portion placed on the lower end of the heat insulating member has a planar shape forming an angle of 0° to 70° with the horizontal direction.

25. The apparatus for producing a silicon single crystal according to claim 23, wherein
a tip of the protruding portion placed on the lower end of the heat insulating member has a planar shape forming an angle of 0° to 70° with the horizontal direction.

26. The apparatus for producing a silicon single crystal according to claim 22, wherein
the protruding portion placed on the lower end of the heat insulating member is made of a silicon single crystal and treated with surface etching.

27. The apparatus for producing a silicon single crystal according to claim 25, wherein
the protruding portion placed on the lower end of the heat insulating member is made of a silicon single crystal and treated with surface etching.

28. The apparatus for producing a silicon single crystal according to claim 21, wherein
the reference member has a surface gloss of 50% or more.

29. The apparatus for producing a silicon single crystal according to claim 27, wherein
the reference member has a surface gloss of 50% or more.

* * * * *

UNITED STATES PATENT AND TRADEMARK OFFICE
CERTIFICATE OF CORRECTION

PATENT NO. : 8,085,985 B2  
APPLICATION NO. : 12/225918  
DATED : December 27, 2011  
INVENTOR(S) : Masahiko Urano et al.

Page 1 of 1

It is certified that error appears in the above-identified patent and that said Letters Patent is hereby corrected as shown below:

Title Page, Item (54), and Col. 1, line 3-9, change "METHOD FOR DETERMINING DISTANCE BETWEEN REFERENCE MEMBER AND MELT SURFACE, METHOD FOR CONTROLLING LOCATION OF MELT SURFACE USING THE SAME, AND APPARATUS FOR PRODUCTION SILICON SINGLE CRYSTAL"

to

--METHOD FOR DETERMINING DISTANCE BETWEEN REFERENCE MEMBER AND MELT SURFACE, METHOD FOR CONTROLLING LOCATION OF MELT SURFACE USING THE SAME, AND APPARATUS FOR PRODUCING SILICON SINGLE CRYSTAL--

Signed and Sealed this  
Twentieth Day of March, 2012

David J. Kappos  
*Director of the United States Patent and Trademark Office*